(12) United States Patent
Broekaert

(10) Patent No.: US 6,366,229 B2
(45) Date of Patent: *Apr. 2, 2002

(54) SYSTEM FOR CONTINUOUS-TIME MODULATION

(75) Inventor: Tom P. E. Broekaert, Calabasas, CA (US)

(73) Assignee: Raytheon Company, Lexington, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/478,040

(22) Filed: Jan. 5, 2000

Related U.S. Application Data

(60) Provisional application No. 60/115,194, filed on Jan. 6, 1999.

(51) Int. Cl.[7] .............................................. H03M 1/12
(52) U.S. Cl. ..................... 341/155; 341/133; 327/291
(58) Field of Search .............................. 341/155, 133, 341/143, 156; 326/134, 132; 327/195, 196, 291, 65; 307/352; 377/128

(56) References Cited

U.S. PATENT DOCUMENTS

| | | | |
|---|---|---|---|
| 3,569,733 A | 3/1971 | Weischedel | 307/222 |
| 3,701,148 A | 10/1972 | Frei | 340/347 AD |
| 3,815,124 A | 6/1974 | Brewer | 340/347 AD |
| 3,889,134 A | 6/1975 | Basham | 307/268 |
| 5,132,557 A * | 7/1992 | Uchida et al. | 307/352 |
| 5,272,480 A | 12/1993 | Lee | 341/133 |
| 5,444,751 A | 8/1995 | Sage | 377/78 |
| 5,563,530 A | 10/1996 | Frazier et al. | 326/132 |
| 5,698,997 A | 12/1997 | Williamson, III et al. | 326/134 |
| 5,815,008 A | 9/1998 | Williamson, III et al. | 326/134 |
| 5,874,911 A | 2/1999 | Kodama | 341/156 |
| 5,930,323 A | 7/1999 | Tang et al. | 377/77 |
| 6,037,819 A * | 3/2000 | Broekaert | 327/291 |

FOREIGN PATENT DOCUMENTS

| | | | |
|---|---|---|---|
| DE | 27 55 228 A | 6/1979 | H03C/1/54 |
| EP | SU 1370758 A1 | 1/1988 | H03K/5/24 |

OTHER PUBLICATIONS

Sun C.K., et al: "A Bridge Type Optoelectronic Sample and Hold Circuit", Proceedings of the International Symposium on Circuits and Systems, US, New York, IEEE, vol. Symp. 24, 1991, pp. 3003–3006, Jun. 1991.
PCT International Search Report dated Apr. 25, 2000 for PCT/US 00/00174 dated Jan. 5, 2000.
Fushimi, K., "Pulse Circuits Using Esaki Diodes", Electronics and Communications in Japan., vol. 47, No. 4, Apr. 1964, pp. 142–152, XP–000907071, Scripta Technica, NY, US.

(List continued on next page.)

Primary Examiner—Brian Young
Assistant Examiner—John Nguyen
(74) Attorney, Agent, or Firm—Baker Botts L.L.P.

(57) ABSTRACT

A continuous-time modulator comprises a modulator bridge having a bridge input terminal, an inverted bridge input terminal, a clock terminal and an inverted clock terminal. The modulator further comprises an input amplifier for amplifying an input signal and the input signal inverted and a bridge amplifier coupled to the input amplifier. The bridge is coupled to the bridge amplifier. The modulator further comprises a feedback amplifier coupled to the bridge, with the bridge amplifier coupled to the feedback amplifier. A clock amplifier for amplifying a clock signal and the clock signal inverted is also coupled to the bridge. An output signal is provided at an output terminal coupled to the bridge input terminal. An inverted output signal is provided at an output terminal coupled to the inverted bridge input terminal.

24 Claims, 3 Drawing Sheets

OTHER PUBLICATIONS

H. B. Baskin, "N-Valued Logic Circuit", IBM Technical Disclosure Bulletin, vol. 3, No. 10, Mar. 1, 1961.

PCT International Search Report dated Jun. 29, 2000 for PCT/US00/00173 filed Jan. 5, 2000.

PCT International Search Report dated Jun. 13, 2000 for PCT/US00/00171 filed Jan. 5, 2000.

Mir, S., et al, "Unified Built–In Self–Test for Fully Differential Analog Circuits", Journal of Electronic Testing: Theory and Applications 9, 135–151 (1996), 1996 Kluwer Academic Publishers.

Sen–Jung Wei, et al, "A Self–Latching A/D Converter Using Resonant Tunneling Diodes", IEEE Journal of Solid–State Circuits, vol. 28, No. 6, Jun. 1993, pp. 697–700.

Takumi Miyashita, et al., "5 GHz ΣΔ Analog–to–Digital Converter with Polarity Alternating Feedback Comparator", IEEE Gallium Arsenide Integrated Circuit Symposium, pp. 91–94, 1997.

Kleks, J., "A 4–Bit Single Chip Analog to Digital Converter with A 1.0 Gigahertz Analog Input Bandwidth", IEEE Gallium Arsenide Integrated Circuit Symposium, pp. 79–82, 1987.

PCT Written Opinion dated May 29, 2001 for PCT/US00/00173 filed Jan. 5, 2000.

* cited by examiner

SYSTEM FOR CONTINUOUS-TIME MODULATION

RELATED APPLICATION

This application claims the benefit of U.S. Provisional Application Ser. No. 60/115,194, filed Jan. 6, 1999.

TECHNICAL FIELD OF THE INVENTION

This invention relates generally to time modulation and more particularly to a system for continuous-time modulation.

BACKGROUND OF THE INVENTION

Continuous-time modulators conventionally require the use of an analog-to-digital converter. Analog-to-digital converters have been designed in a variety of architectures. Conventionally, these architectures have been implemented with transistors. For example, one common implementation includes a cross-coupled pair of transistors. However, there are several disadvantages associated with using transistors to implement an analog-to-digital converter.

First, components used in digital circuits are becoming smaller and smaller. As these components decrease in size, quantum mechanical effects begin to influence the circuit performance. The electrical properties of conventional transistors may be altered in an unacceptable way by the quantum mechanical effects. Secondly, a transistor-implemented analog-to-digital converter is limited by the switching speed of the transistors, which may be too slow for some applications. Finally, conventional transistors are limited to two stable states. Thus, systems using transistors typically convert analog signals into binary digital signals, making the use of multi-valued logic difficult.

SUMMARY OF THE INVENTION

In accordance with the present invention, a system for continuous-time modulation is provided that substantially eliminates or reduces the disadvantages or problems associated with previously developed systems. In particular, the present invention provides a system for continuous-time modulation to quantize an analog signal without the use of transistors.

In one embodiment of the present invention, a continuous-time modulator is provided that comprises a modulator bridge having a bridge input terminal, an inverted bridge input terminal, a clock terminal and an inverted clock terminal. The modulator further comprises an input amplifier for amplifying an input signal and an inverted input signal and a bridge amplifier coupled to the input amplifier. The bridge amplifier is also coupled to the bridge. The modulator further comprises a feedback amplifier coupled to the bridge and the bridge amplifier, and a clock amplifier for amplifying a clock signal and an inverted clock signal. The bridge is coupled to the clock amplifier. An output signal is present at an output terminal that is coupled to the bridge input terminal. An inverted output signal is present at an inverted output terminal coupled to the inverted bridge input terminal.

Technical advantages of the present invention include providing an improved system for continuous-time modulation. In particular, a negative-resistance device such as a resonant tunneling diode is utilized in the implementation of the continuous-time modulator. Accordingly, reliance on transistors is avoided. As a result, quantum mechanical effects are not detrimental, the switching speed is increased, and the use of multi-valued logic is made possible.

Other technical advantages of the present invention will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings.

DETAILED DESCRIPTION OF THE INVENTION

The preferred embodiments of the present invention and its advantages are best understood by referring now in more detail to FIGS. 1 through 10 of the drawings, in which like numerals refer to like parts.

Figure 1:
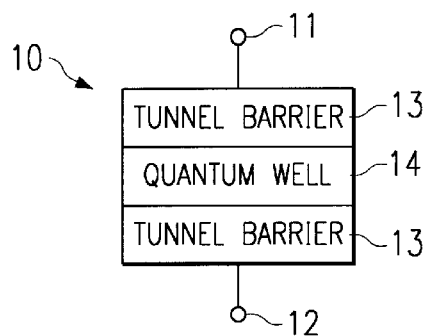
FIG. 1 is a schematic diagram of a resonant tunneling diode (RTD) for use as a negative-resistance element in accordance with the teachings of the present invention.

FIG. 1 is a schematic diagram of a resonant tunneling diode (RTD) 10 for use as a negative-resistance element in accordance with the teachings of the present invention. RTD 10 comprises an input terminal 11 for receiving an input signal, an output terminal 12 for producing an output signal, two tunnel barrier layers 13, and a quantum well layer 14.

Figure 2:
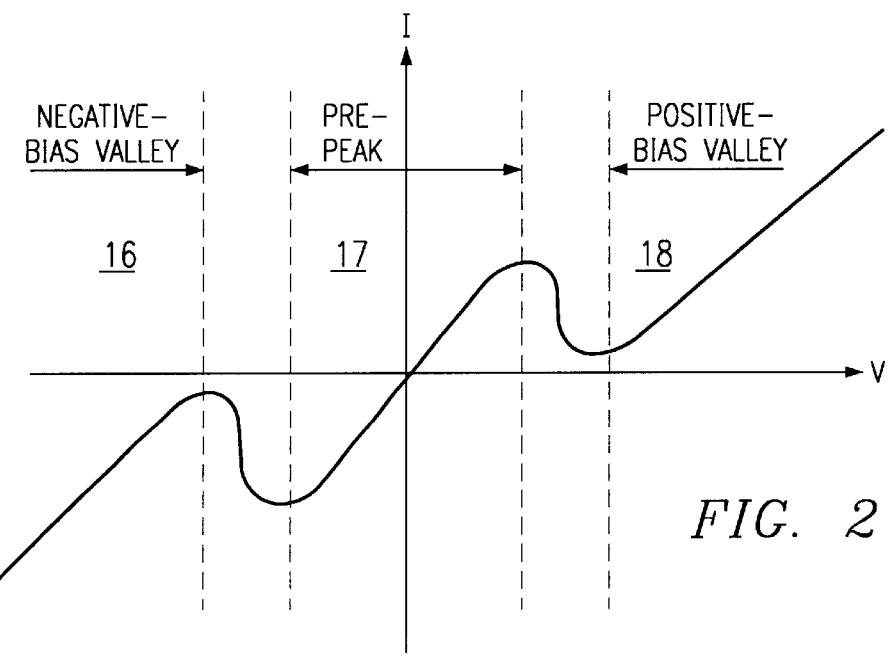
FIG. 2 is a graph of current as a function of voltage for the negative-resistance element illustrated in FIG. 1.

FIG. 2 is a graph showing current as a function of voltage for a negative-resistance element such as an RTD 10. The shape of this I-V curve is determined by the quantum effects that are a result of the extreme thinness of tunnel barrier layers 13 and quantum well layer 14. These layers 13 and 14 are approximately ten (10) to twenty (20) atoms thick.

When a voltage of low amplitude is applied to input terminal 11, almost no electrons tunnel through both tunnel barrier layers 13. This results in a negligible current and the RTD 10 is switched off. As the voltage increases, the energy of the electrons received at input terminal 11 also increases and the wavelength of these electrons decreases. When a particular voltage level is reached at input terminal 11, a specific number of electron wavelengths will fit within quantum well layer 14. At this point, resonance is established as electrons that tunnel through one tunnel barrier layer 13 remain in quantum well layer 14, giving those electrons opportunities to tunnel through the second tunnel barrier layer 13 to output terminal 12. Thus, a current flow is established from input terminal 11 to output terminal 12 and RTD 10 is switched on. However, if the voltage level continues to rise, eventually no electrons will have the proper wavelength to tunnel through tunnel barrier layers 13 and RTD 10 is switched off. This property of negative-resistance elements such as RTDs 10 that allows switching back and forth between on and off states as the voltage increases enables biasing to operate in one of three stable states, as illustrated in FIG. 2. These three stable states are the negative-bias valley region 16, the pre-peak region 17, and the positive-bias valley region 18.

Another property associated with the extreme thinness of tunnel barrier layers 13 and quantum well layer 14 of RTD 10 relates to switching speed. Because each of these layers 13 and 14 are only about ten (10) to twenty (20) atoms thick, an electron only travels about 0.01 microns from input terminal 11 to output terminal 12. Because of this short distance, RTD 10 switches on and off at a very high rate.

Figure 3:
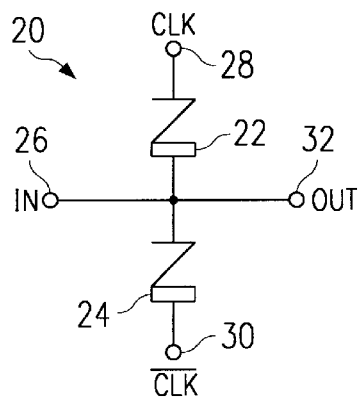
FIGS. 3 and 4 are circuit diagrams illustrating a system for quantizing an analog signal in accordance with first and second embodiments of the present invention.
Figure 4:
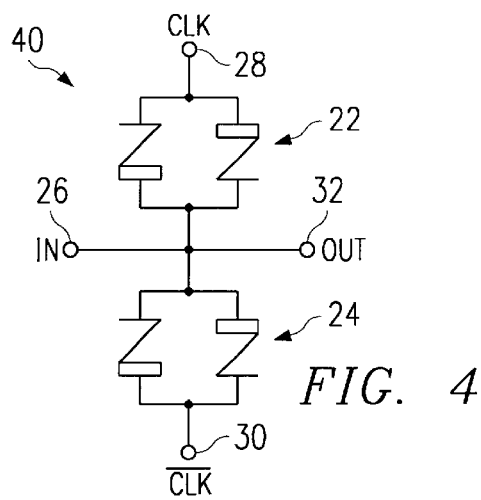

FIGS. 3 and 4 are circuit diagrams illustrating systems 20 and 40 for quantizing an analog signal in accordance with the present invention. Systems 20 and 40 comprise a first resonant tunneling diode(s) 22 and a second resonant tunneling diode(s) 24. Systems 20 and 40 also comprise an input terminal 26 for receiving an analog input signal, a clock terminal 28 for receiving a clock signal, an inverted clock terminal 30 for receiving an inverted clock signal, and an output terminal 32 for producing a quantized output signal.

According to one embodiment of the present invention, the input received at input terminal 26 comprises a current varying signal, while the output at output terminal 32 comprises a voltage varying signal. In one implementation of systems 20 and 40, the input signal varies in the X-band range (ten or more gigahertz). In the system 20 shown in FIG. 3, the RTDs 22 and 24 are biased the same with respect to the clock terminal 28. In the system 40 shown in FIG. 4, the RTDs 22 and 24 each comprise a pair connected in parallel and biased oppositely to each other.

In systems 20 and 40, the RTDs operate in the pre-peak region 17 when the input current is zero. This produces an output signal of zero voltage. However, when the input current reaches a specified level, one of the RTDs 22 or 24 is forced by the resultant asymmetry into either the negative-bias valley region 16, resulting in an output signal of −1, or the positive-bias valley region 18, resulting in an output signal of +1.

According to the present invention, the output terminal 32 produces a +1 voltage signal for the output when the input signal is greater than a first threshold, a −1 voltage signal for the output when the input signal is less than a second threshold, and a zero voltage signal for the output when the input signal is between the first and second thresholds.

In the embodiment shown in FIG. 3, the system 20 comprises a single RTD 22 and a single RTD 24. This embodiment provides a more compact layout and operates at a higher speed than the embodiment shown in FIG. 4, wherein each of the RTDs 22 and 24 comprises a pair. However, the embodiment shown in FIG. 4 provides more symmetry and reduces even-order harmonics that may exist in the embodiment shown in FIG. 3.

Figure 5:
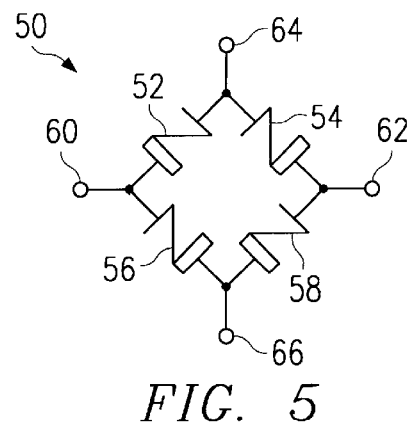
FIGS. 5, 6 and 7 are circuit diagrams illustrating a bridge for quantizing an analog signal in accordance with additional embodiments of the present invention.
Figure 6:
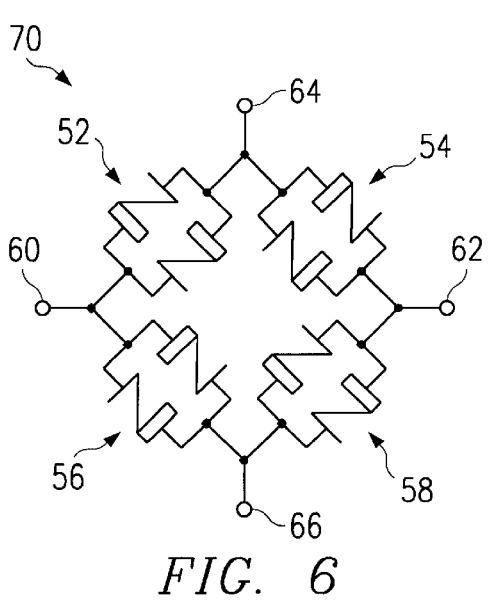
Figure 7:
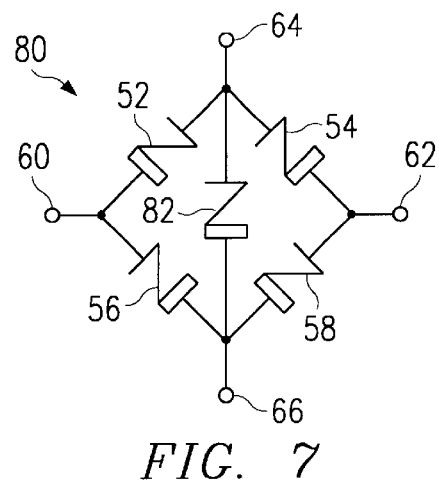

FIGS. 5, 6 and 7 are circuit diagrams illustrating bridges 50, 70 and 80 for quantizing an analog signal in accordance with the present invention. Bridges 50, 70 and 80 comprise a first resonant tunneling diode(s) 52, a second resonant tunneling diode(s) 54, a third resonant tunneling diode(s) 56, and a fourth resonant tunneling diode 58. Bridges 50, 70 and 80 also comprise an input terminal 60 for receiving an analog input signal, an inverted input terminal 62 for receiving an inverted input signal, a clock terminal 64 for receiving a clock signal, and an inverted clock terminal 66 for receiving an inverted clock signal.

In the embodiment shown in FIG. 5, each RTD 52, 54, 56 and 58 is biased the same with respect to the clock terminal 64. In the embodiment shown in FIG. 6, each RTD 52, 54, 56 and 58 comprises a diode pair in parallel and biased oppositely to each other. The system 80 shown in FIG. 7 comprises a fifth resonant tunneling diode 82. In this embodiment, each RTD 52, 54, 56, 58 and 82 is biased the same with respect to the clock terminal 64. However, as an alternative, each RTD 52, 54, 56, 58 and 82 may comprise an RTD pair in parallel and biased oppositely to each other.

In bridges 50 and 70, the RTDs 52, 54, 56 and 58 operate in the pre-peak region 17, see FIG. 2, when the input current is zero. This produces an output signal of zero. However, when the input current reaches a specified level, an asymmetry results producing an output signal of −1 or +1.

A determination regarding whether the output signal will be −1 or +1 is made when the clock signal level increases. In this situation, bridges 50 and 70 become positively biased and two of the RTDs 52, 54, 56 and 58 operate in either the negative-bias valley region 16, producing an output signal of −1 volts, or the positive-bias valley region 18, producing an output signal of +1 volts. If the input current level causes the RTD 52 to switch, the RTD 58 will also switch. However, if the input current level causes the RTD 54 to switch, the RTD 56 will be the second one to switch. If the RTDs 52 and 58 switch, the output signal will be +1 volts, while if the RTDs 54 and 56 switch, the output signal will be −1 volts.

A determination regarding whether the output signal will be −1 or +1 is also made when the clock signal level decreases. In this situation, bridges 50 and 70 become negatively biased and two of the RTDs 52, 54, 56, and 58 are forced into either the negative-bias valley region 16, see FIG. 2, or the positive-bias valley region 18 as just described in connection with a clock signal increase. As before, either the RTDs 52 and 58 or the RTDs 54 and 56 will switch. In this case, however, if the RTDs 52 and 58 switch, the output signal will be −1, while if RTDs 54 and 56 switch, the output signal will be +1.

In bridge 80, the fifth RTD 82 creates an asymmetry that forces one of the pair of RTDs either 52 and 58 or 54 and 56 into the negative-bias valley region 16 or the positive-bias valley region 18. In this configuration, there is essentially no input signal that will result in an output signal of zero. Thus, for the embodiment in which the bridge 80 comprises a fifth RTD, the output signal produced will be binary instead of ternary.

As with bridges 50 and 70, bridge 80 operates to determine the value of the output signal both when the clock increases and when the clock decreases. Therefore, bridges 50, 70 and 80 produce two outputs for each clock cycle. Thus, in order to obtain 25 gigasamples per second, for example, a 12.5 gigahertz clock is sufficient.

The embodiments shown in FIGS. 5 and 7, where single RTDs 52, 54, 56, 58 and RTD 82 of FIG. 7 comprise the bridge, a more compact layout is provided that operates at a higher speed than the embodiment shown in FIG. 6, where each RTD 52, 54, 56 and 58 comprises a pair. However, the embodiment shown in FIG. 6 provides more symmetry and reduces even-order harmonics that may exist in the embodiments shown in FIGS. 5 and 7.

Figure 8:
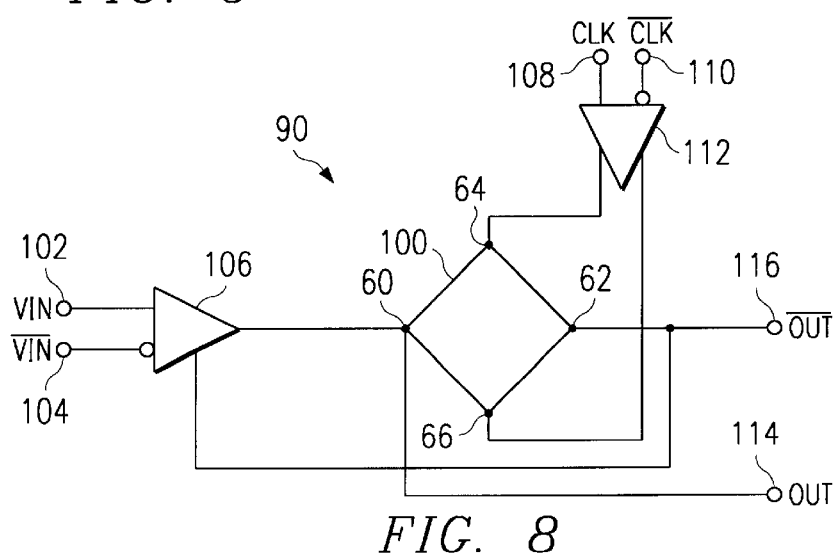
FIG. 8 is a circuit diagram illustrating the bridge of FIGS. 5, 6 and 7 in a direct drive mode.

FIG. 8 is a circuit diagram illustrating a system 90 for quantizing an analog signal in a direct drive mode. System 90 comprises a bridge 100 configured according to one of the embodiments shown in FIG. 5, 6 or 7. Thus, bridge 100 comprises an input terminal 60 for receiving an analog input signal, an inverted input terminal 62 for receiving an inverted input signal, a clock terminal 64 for receiving a clock signal, and an inverted clock terminal 66 for receiving an inverted clock signal.

According to the embodiment shown in FIG. 8, the input comprises a voltage varying signal received at a system input terminal 102. The inverted input signal is received at system input terminal 104. The input signal and the inverted input signal are applied to an input amplifier 106 having an output connected to the input terminal 60 and the inverted input terminal 62, respectively. Similarly, the clock signal is received at clock input terminal 108 and the inverted clock signal is received at a clock input terminal 110. The clock signal and the inverted clock signal are applied to a clock amplifier 112 having one output applied to the clock terminal 64 and a second output applied to the inverted clock terminal 66, respectively.

An output signal from system 90 is provided at a system output 114 and an inverted system output is provided at an inverted system output 116. According to one embodiment, the output comprises a signal varying with current. The system output 114 is coupled to the input terminal 60 of the bridge 100, and the inverted system output 116 is coupled to the inverted input terminal 62 of the bridge 100.

When the bridge 100 is constructed in accordance with FIG. 5 or 6, the output signal comprises three levels represented by −1, 0, and +1. According to the present invention, the input amplifier 106 amplifies the input signal and the inverted input signal, and the clock amplifier 112 amplifies the clock signal and the inverted clock signal. With this amplification, a +1 is produced for the output signal when the input signal is greater than a first threshold, a −1 for the output signal when the input signal is less than a second threshold, and a zero for the output signal when the input signal is between the first and second thresholds.

When the bridge 100 is constructed in accordance with FIG. 7, the output signal comprises one of two levels represented by −1 and +1. According to the present invention, the input amplifier 106 amplifies the input signal and the inverted input signal, the clock amplifier 112 amplifies the clock signal and the inverted clock signal. With this amplification, a +1 is produced for the output signal when the input signal is greater than a first threshold and a −1 for the output signal when the input signal is less than a second threshold.

Figure 9:
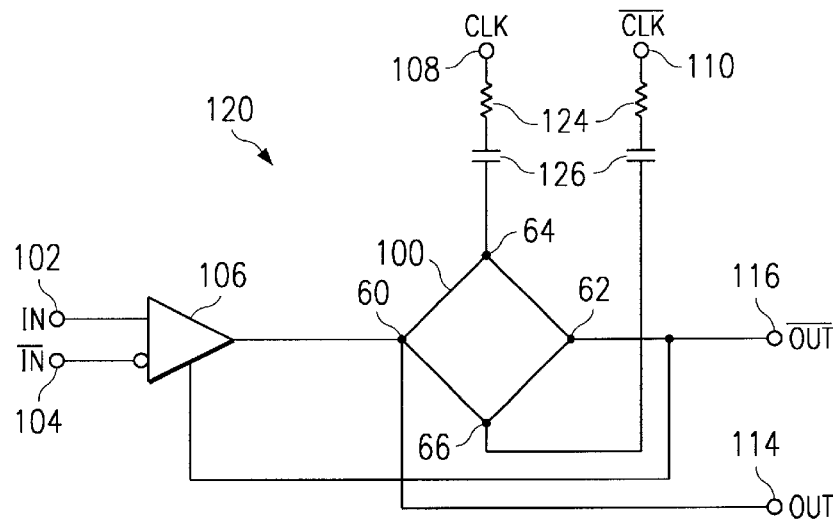
FIG. 9 is a circuit diagram illustrating the bridge of FIGS. 5, 6 and 7 in a capacitive-coupled drive mode.

FIG. 9 is a circuit diagram illustrating a system 120 for quantizing an analog signal in a capacitive-coupled drive mode. System 120 comprises a bridge 100 formed according to one of the embodiments shown in FIG. 5, 6 or 7. Thus, bridge 100 comprises an input terminal 60 for receiving an analog input signal, an inverted input terminal 62 for receiving an inverted input signal, a clock terminal 64 for receiving a clock signal, and an inverted clock terminal 66 for receiving an inverted clock signal.

According to the embodiment shown in FIG. 9, the input comprises a current varying signal received at the system input terminal 102. The inverted input signal is received at the system input terminal 104. The input signal and the inverted input signal are applied to the input amplifier 106 having outputs connected to the input terminal 60 and inverted input terminal 62, respectively. Similarly, the clock signal is received at the clock input terminal 108 and the inverted clock signal is received at the clock input terminal 110. The clock signal and the inverted clock signal are applied to resistors 124 and capacitors 126 and then connected to the clock terminal 64 and inverted clock terminal 66, respectively.

An output signal is provided from the system 120 at a system output terminal 114 and an inverted output signal is provided at an inverted system output terminal 116. The output comprises a voltage varying signal. The system output terminal 114 is coupled to the bridge 100 at the input terminal 60, and the inverted system output terminal 116 is coupled to the bridge 100 at the inverted input terminal 62.

In the capacitive-coupled drive mode shown in FIG. 9, the output comprises one of two levels represented by −1 and +1 independent of whether bridge 100 is configured in accordance with the embodiment shown in FIG. 5, 6 or 7. According to the present invention, the input amplifier 106 amplifies the input signal and the inverted input signal. For system 120, the output signal at the system output 114 is +1 when the input signal is greater than a first threshold and a −1 when the input signal is less than a second threshold.

Figure 10:
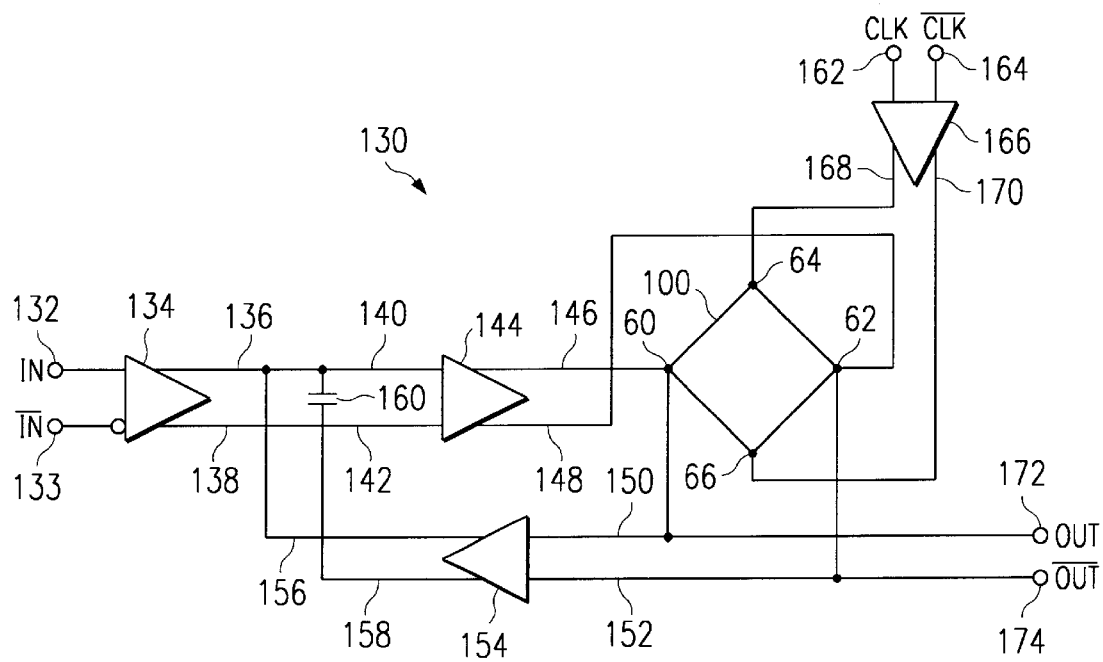
FIG. 10 is a circuit diagram illustrating a continuous-time modulator constructed in accordance with another embodiment of the present invention.

FIG. 10 is a circuit diagram illustrating a continuous-time modulator 130 in accordance with the present invention. Modulator 130 comprises a bridge 100 according to one of the embodiments shown in FIG. 5, 6 or 7. Thus, bridge 100 comprises an input terminal 60 for receiving an analog input signal, an inverted input terminal 62 for receiving an inverted input signal, a clock terminal 64 for receiving a clock signal, and an inverted clock terminal 66 for receiving an inverted clock signal.

For the modulator 130 shown in FIG. 10, the input comprises a current varying signal and is received at a system input terminal 132. The inverted input signal is received at a system input terminal 133. The input signal and the inverted input signal are applied to an input amplifier 134 having outputs on connecting lines 136 and 138, respectively. The lines 136 and 138 are connected to terminals 140 and 142, respectively, of a bridge amplifier 144 having outputs on connecting lines 146 and 148. The connecting lines 146 and 148 are connected to the input terminal 60 and inverted input terminal 62, respectively. Also connected to the input terminal 60 and inverted input terminal 62 are lines 150 and 152, respectively. These connecting lines apply the signals at terminals 60 and 62 to a feedback amplifier 154 having outputs on connecting lines 156 and 158. The connecting lines 156 and 158 are coupled to terminals 140 and 142, respectively, to feedback the bridge signals to the bridge amplifier 144. A capacitor 160 provides capacitance coupling between the connecting lines 136 and 138.

The clock signal is received at a clock input terminal he inverted clock signal is received at an inverted clock input terminal 164. The clock signal and the inverted clock signal are applied to a clock amplifier 166 having outputs on lines 168 and 170, respectively. The connecting lines 168 and 170 are tied to the clock terminal 64 and inverted clock terminal 66, respectively.

Also, the modulator 130 comprises an output terminal 172 for the output signal and an inverted output terminal 174 for the inverted output signal. The output comprises a voltage varying signal. Output terminal 172 is coupled to the bridge 100 at the input terminal 60, and the inverted output terminal 174 is coupled to the bridge at the inverted input terminal 62.

When the bridge 100 is configured in accordance with FIG. 5 or 6, the output signal comprises one of three levels represented by −1, 0, and +1. According to the present invention, input amplifier 134 amplifies the input signal and the inverted input signal, the bridge amplifier 144 amplifies the signals received at terminals 140 and 142, the feedback amplifier 154 amplifies the signals received on the lines 150 and 152, and the clock amplifier 166 amplifies the clock signal and the inverted clock signal. For the modulator 130, the output signal at the terminal 172 is +1 when the input signal is greater than a first threshold, a −1 when the input signal is less than a second threshold, and a zero when the input signal is between the first and second thresholds.

When the bridge 100 is configured in accordance with FIG. 7, the output signal comprises one of two levels represented by −1 and +1. The input amplifier 134 amplifies signals applied thereto, bridge amplifier 144 amplifies received signals, feedback amplifier 154 amplifies inputs thereto, and clock amplifier 166 amplifies the clock signals. At the output terminal 172, the output signal is a +1 when the input signal is greater than a first threshold and a −1 when the input signal is less than a second threshold.

The amplification of clock amplifier 166 is about four to ten times greater than the amplification of bridge amplifier 144. This boosts the digital signal thereby reducing the analog feedback in comparison. This also reduces output resistance and increases both speed and sensitivity.

Although the present invention has been described with several embodiments, various changes and modifications may be suggested in the art. It is intended that the present invention encompass such changes and modifications as fall within the scope of the appended claims.

What is claimed is:

1. A continuous-time modulator comprising:
   a modulator bridge having a bridge input terminal, an inverted bridge input terminal, a clock terminal and an inverted clock terminal;
   an input amplifier receiving an input signal and an inverted input signal for amplification thereof;
   a bridge amplifier coupled to receive amplified signals from the input amplifier, the bridge amplifier having outputs applied to the bridge;
   a feedback amplifier coupled to receive outputs from the bridge, the feedback amplifier having outputs applied to the bridge amplifier;
   a clock amplifier receiving a clock signal and an inverted clock signal for amplification, the bridge coupled to receive the outputs of the clock amplifier;
   an output terminal providing an output signal, the output terminal coupled to the bridge input terminal; and
   an inverted output terminal providing an inverted output signal, the inverted output terminal coupled to the inverted bridge input terminal.

2. The system of claim 1 wherein the input signal comprises a varying current.

3. The system of claim 1 wherein the output signal comprises a varying voltage.

4. The system of claim 1 wherein the output signal comprises one of three levels represented by −1, 0, and +1.

5. The system of claim 1 wherein the input signal comprises a signal in the X-band range.

6. The system of claim 1 wherein the bridge amplifier further comprises a first input terminal and a second input terminal and further comprising a capacitor having a first terminal coupled to the first input terminal and a second terminal coupled to the second input terminal.

7. The system of claim 1 wherein the clock amplifier has an amplification factor between about four and about ten times greater than the amplification factor of the bridge amplifier.

8. The system of claim 1 wherein the modulator bridge further comprises:
   a first negative-resistance device having a first terminal coupled to the clock terminal and a second terminal coupled to the bridge input terminal;
   a second negative-resistance device having a first terminal coupled to the clock terminal and a second terminal coupled to the inverted bridge input terminal;
   a third negative-resistance device having a first terminal coupled to the bridge input terminal and a second terminal coupled to the inverted clock terminal; and
   a fourth negative-resistance device having a first terminal coupled to the inverted bridge input terminal and a second terminal coupled to the inverted clock terminal.

9. The system of claim 8 wherein the first, second, third and fourth negative-resistance devices are biased the same with respect to the clock terminal.

10. The system of claim 8 wherein the first, second, third and fourth negative-resistance devices each comprise a first resonant tunneling diode in parallel with a second resonant tunneling diode and wherein the first resonant tunneling diode has an opposite bias as the second resonant tunneling diode.

11. The system of claim 8, further comprising a fifth negative-resistance device having a first terminal coupled to the clock terminal and a second terminal coupled to the inverted clock terminal.

12. The system of claim 11 wherein the first, second, third, fourth and fifth negative-resistance devices each comprise a resonant tunneling diode.

13. The system of claim 11 wherein the first, second, third, fourth and fifth negative-resistance devices are biased the same with respect to the clock terminal.

14. The system of claim 11 wherein the first, second, third and fourth negative-resistance devices each comprise a first resonant tunneling diode in parallel with a second resonant tunneling diode and wherein the first resonant tunneling diode has an opposite bias to the second resonant tunneling diode.

15. The system of claim 11 wherein the output signal comprises one of two levels represented by −1 and +1.

16. A continuous-time modulator comprising:
   a modulator bridge having a bridge input terminal, and inverted bridge input terminal, a clock terminal receiving a clock signal and an inverted clock terminal receiving an inverted clock signal;
   an amplifier receiving an input signal and an inverted input signal for amplification thereof, the amplifier having outputs applied to the bridge;
   a feedback amplifier coupled to receive outputs from the bridge, the feedback amplifier having outputs applied to the amplifier;
   an output terminal providing an output signal, the output terminal coupled to the bridge input terminal; and
   an inverted output terminal providing an inverted output signal, the inverted output terminal coupled to the inverted bridge input terminal.

17. The system of claim 16, wherein the amplifier further comprises a first input terminal and a second input terminal and further comprising a capacitor having a first terminal coupled to the first input terminal and a second terminal coupled to the second input terminal.

18. The system of claim 16 wherein the modulator bridge further comprises:
   a first negative-resistance device having a first terminal coupled to the clock terminal and a second terminal coupled to the bridge input terminal;
   a second negative-resistance device having a first terminal coupled to the clock terminal and a second terminal coupled to the inverted bridge input terminal;
   a third negative-resistance device having a first terminal coupled to the bridge input terminal and a second terminal coupled to the inverted clock terminal; and a fourth negative-resistance device having a first terminal coupled to the inverted bridge input terminal and a second terminal coupled to the inverted clock terminal.

19. The system of claim 18 wherein the first, second, third and fourth negative-resistance devices are biased the same with respect to the clock terminal.

20. The system of claim 18 wherein the first, second, third and fourth negative-resistance devices each comprise a first resonant tunneling diode in parallel with a second resonant tunneling diode and wherein the first resonant tunneling diode has an opposite bias as the second resonant tunneling diode.

21. The system of claim 18, further comprising a fifth negative-resistance device having a first terminal coupled to the inverted clock terminal.

22. The system of claim 21 wherein the first, second, third, fourth and fifth negative-resistance devices each comprise a resonant tunneling diode.

23. The system of claim 21 wherein the first, second, third, fourth and fifth negative-resistance devices are biased the same with respect to the clock terminal.

24. The system of claim 21 wherein the first, second, third and fourth negative-resistance devices each comprise a first resonant tunneling diode in parallel with a second resonant tunneling diode and wherein the first resonant tunneling diode has an opposite bias to the second resonant tunneling diode.

* * * * *